(12) United States Patent
Shuto et al.

(10) Patent No.: US 6,187,632 B1
(45) Date of Patent: Feb. 13, 2001

(54) ANNEAL TECHNIQUE FOR REDUCING AMOUNT OF ELECTRONIC TRAP IN GATE OXIDE FILM OF TRANSISTOR

(75) Inventors: Susumu Shuto; Miwa Tanaka; Masahisa Sonoda, all of Yokohama; Toshiaki Idaka, Yokosuka; Kenichi Sasaki, Yokohama; Seiichi Mori, Tokyo, all of (JP)

(73) Assignee: Kabushiki Kaisha Toshiba, Kawasaki (JP)

( * ) Notice: Under 35 U.S.C. 154(b), the term of this patent shall be extended for 0 days.

(21) Appl. No.: 08/994,134

(22) Filed: Dec. 19, 1997

(30) Foreign Application Priority Data

Dec. 27, 1996 (JP) .................................................. 8-349753

(51) Int. Cl.⁷ .......................... H01L 21/66; H01L 21/336
(52) U.S. Cl. .......................... 438/257; 438/17; 438/261; 438/902; 438/904
(58) Field of Search .................................. 438/781, 264, 438/288, 287, 308, 257–263, 778, 17, 18, 902, 904

(56) References Cited

U.S. PATENT DOCUMENTS

| | | | |
|---|---|---|---|
| 5,065,222 | * 11/1991 | Ishii | 357/52 |
| 5,139,971 | * 8/1992 | Giridhar et al. | 437/195 |
| 5,279,981 | * 1/1994 | Fukatsu et al. | 437/43 |
| 5,397,720 | * 3/1995 | Kwong et al. | 438/301 |

FOREIGN PATENT DOCUMENTS 61-219141   9/1986  (JP) .

* cited by examiner

Primary Examiner—Charles Bowers
Assistant Examiner—Thanhha Pham
(74) Attorney, Agent, or Firm—Banner & Witcoff, Ltd.

(57) ABSTRACT

A memory cell of EEPROM having a floating gate, a control gate, a drain region, and a source region is formed on a silicon substrate. Thereafter, a BPSG film (interlayer insulating film) covering the memory cell is formed by CVD. After a wire including a bit line, an SiON film (passivation film), covering the silicon substrate and serving as an uppermost layer, is formed on an upper portion of the silicon substrate. Thereafter, annealing is performed to discharge water in the BPSG film to an outer portion of an LSI. The annealing is performed under a condition satisfying the following equation of $$t \geq 7.86 \times 10^{-11} \times L^2 \times \exp(9115/T)$$

where t is anneal time (minutes), L is a thickness (nm) of the passivation film, and T is anneal temperature (absolute temperature). Thereby, an amount of electronic trap in a gate oxide film of the transistor can be reduced.

11 Claims, 5 Drawing Sheets

ANNEAL TECHNIQUE FOR REDUCING AMOUNT OF ELECTRONIC TRAP IN GATE OXIDE FILM OF TRANSISTOR

BACKGROUND OF THE INVENTION

The present invention relates to an anneal technique for reducing an amount of electronic trap in a gate oxide film of a transistor, which is applied to a semiconductor device using an insulating film, which is formed by a chemical reaction of gas as material, as a passivation film.

A passivation film, which is formed of $SiO_2$, $Si_3N_4$, or $SiO_xN_y$ (x, y denote arbitrary positive numbers each showing an atomic ratio), is often used in LSI. As an interlayer insulating film of a lower layer of the passivation film, there is used an insulating film of silicon glass series such as PSG, BPSG, ASG, BSP, CSG, etc.

The insulating film used as a passivation film has low hygroscopicity and water permeability, and the insulating film used as an interlayer insulating film has a property of easily absorbing water. The interlayer insulating film contains water permeated mainly in manufacturing the interlayer insulating film.

Water molecules in the interlayer insulating film is dispersed in the interlayer insulating film by heat generated in depositing the passivation film. At this time, water molecules neither transmit through the passivation film nor disperse to the outer portion of the semiconductor device. Water molecules disperse into the gate oxide film of the transistor in the semiconductor device. The reason is that the passivation film has a property of permeating water with difficulty (low water permeability).

Water molecules permeated into the gate oxide film of the transistor cause electronic trap in the gate oxide film so as to deteriorate a hot carrier life of the transistor.

To solve the above problem, for example, there is an anneal method for the purpose of removing water of the interlayer insulating film before depositing the passivation film. For example, this method is a well-known technique as disclosed in Japanese Patent Application KOKAI Publication No. 61-219141.

However, in this method, the anneal process must be performed in a cleaning room since the annealing is performed before depositing the passivation film. As a result, the manufacturing cost is increased.

Japanese Patent Application KOKAI Publication No. 61-219141 also discloses removal of water of the interlayer insulating film in a DRAM (dynamic random access memory). To reduce a failure ratio of pose-failure of DRAM, anneal temperature and time may be set to 350° C. and one hour before forming the passivation film (plasma nitrogen film) as described in the above publication.

However, even if the conditions disclosed in the above publication are directly applied to a nonvolatile semiconductor memory such as EEPROM, the electronic trap in the gate oxide film of the memory cell transistor cannot be reduced to an extent that sufficient reliability can be obtained.

In other words, in the nonvolatile semiconductor memory such as EEPROM, it is necessary to review annealing temperature and time in more detail.

Thus, conventionally, the passivation film is formed to prevent water and impurity materials from being permeated from the outer portion of the semiconductor device (LSI). Due to this, the passivation film is formed of material having low hygroscopicity and water permeability. Since the water permeability of the passivation film is low, water of the interlayer insulating material disperses into the gate oxide film of the memory cell transistor to cause electronic trap.

BRIEF SUMMARY OF THE INVENTION

An object of the present invention is to provide a method of manufacturing a passivation film to prevent water of an interlayer insulating film from dispersing into a gate oxide film of a memory cell transistor even if a passivation film is formed of material having low hygroscopicity and water permeability, that is, material having high moisture vapor resistance, thereby improving reliability of the memory cell transistor.

To attain the above object, according to the semiconductor device manufacturing method of the present invention, annealing is performed after forming a passivation film covering an upper portion of a semiconductor substrate on which a transistor is formed.

In this case, an amount of electronic trap in a gate insulating film of the transistor is monitored after annealing, and annealing is performed again when the amount of electronic trap exceeds a predetermined value.

The annealing is performed under at least one of conditions of temperature exceeding 350° C. and time exceeding 60 minutes. Also, the annealing is performed at temperature below a melting point of the metallic wire formed at a lower portion of the passivation film.

The annealing is performed under a condition satisfying the following equation:

$$t \geq 7.86 \times 10^{-11} \times L^2 \times \exp(9115/T)$$

where t is anneal time (minutes), L is a thickness (nm) of the passivation film, and T is anneal temperature (absolute temperature).

The annealing may be performed just after the passivation film is formed. Also, the annealing may be performed after the passivation film is formed and an opening is formed to expose a bonding pad onto the passivation film.

The annealing may be performed under pressure lower than atmosphere.

The transistor is a transistor constituting a memory cell of a semiconductor memory.

The passivation film is one insulating film selected from silicon oxide, silicon nitride and silicon oxynitride, and the passivation film is formed by CVD. Also, the passivation film is formed such that its refractive index is 1.65 or more.

An interlayer insulating film of silicon glass series, is formed at the lower portion of the passivation film. Water in the interlayer insulating film is discharged to an outer portion of the passivation film by the anneal.

Moreover, to attain the above object, the semiconductor manufacturing method comprises a step of annealing before forming a passivation film, which covers the upper portion of a semiconductor substrate having a transistor formed. The annealing is performed under a condition satisfying the following equation:

$$t \geq 7.86 \times 10^{-5} \times \exp(9115/T)$$

where t is anneal time (minutes), and T is anneal temperature (absolute temperature).

The annealing step and the passivation film forming step are continuously performed in one apparatus to prevent water and impurity material from being permeated again.

Also, an amount of electronic trap in a gate insulating film of the transistor is monitored after annealing, and the annealing may be performed again when the amount of electronic trap exceeds a predetermined value.

The annealing is performed under at least one of conditions of temperature exceeding 350° C. and time exceeding 60 minutes.

The annealing is performed at temperature below a melting point of the wire formed at the lower portion of the passivation film.

The annealing may be performed under pressure lower than atmosphere. The transistor is a transistor constituting a memory cell of a semiconductor memory.

The passivation film is one insulating film selected from silicon oxide, silicon nitride and silicon oxynitride, and the passivation film is formed by CVD. The passivation film is formed such that its refractive index is 1.65 or more.

An interlayer insulating film of silicon glass series, is formed at the lower portion of the passivation film. Water in the interlayer insulating film is discharged to an outer portion of the passivation film by the annealing.

Furthermore, to attain the above object, the semiconductor device manufacturing method of the present invention comprises the steps of forming a first passivation film, which covers the upper portion of a semiconductor substrate having a transistor formed, annealing after forming the first passivation film, and forming a second passivation film, having high moisture vapor resistance higher than the first passivation film, on the first passivation film.

The manufacturing method further comprises a step of monitoring an amount of electronic trap in a gate insulating film of the transistor just after annealing. Then, the annealing is performed again when the amount of electronic trap exceeds a predetermined value.

The annealing is performed under at least one of conditions of temperature exceeding 350° C. and time exceeding 60 minutes. Also, the annealing is performed at temperature below a melting point of the wire formed at the lower portion of the passivation film.

The annealing is performed under a condition satisfying the following equation:

$$t \geq 7.86 \times 10^{-11} \times L^2 \times \exp(9115/T)$$

where t is anneal time (minutes), L is a thickness (nm) of the passivation film, and T is anneal temperature (absolute temperature).

The annealing is performed under pressure lower than atmosphere. The transistor is a transistor constituting a memory cell of a semiconductor memory.

The first and second passivation films are one insulating film selected from silicon oxide, silicon nitride and silicon oxynitride, and each of the passivation films is formed by CVD.

The second passivation film is formed such that its refractive index is 1.65 or more.

An interlayer insulating film of silicon glass series, is formed at the lower portion of the passivation film. Water in the interlayer insulating film is discharged to an outer portion of the passivation film by the annealing.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will now be described with reference to the accompanying drawings.

Figure 1:
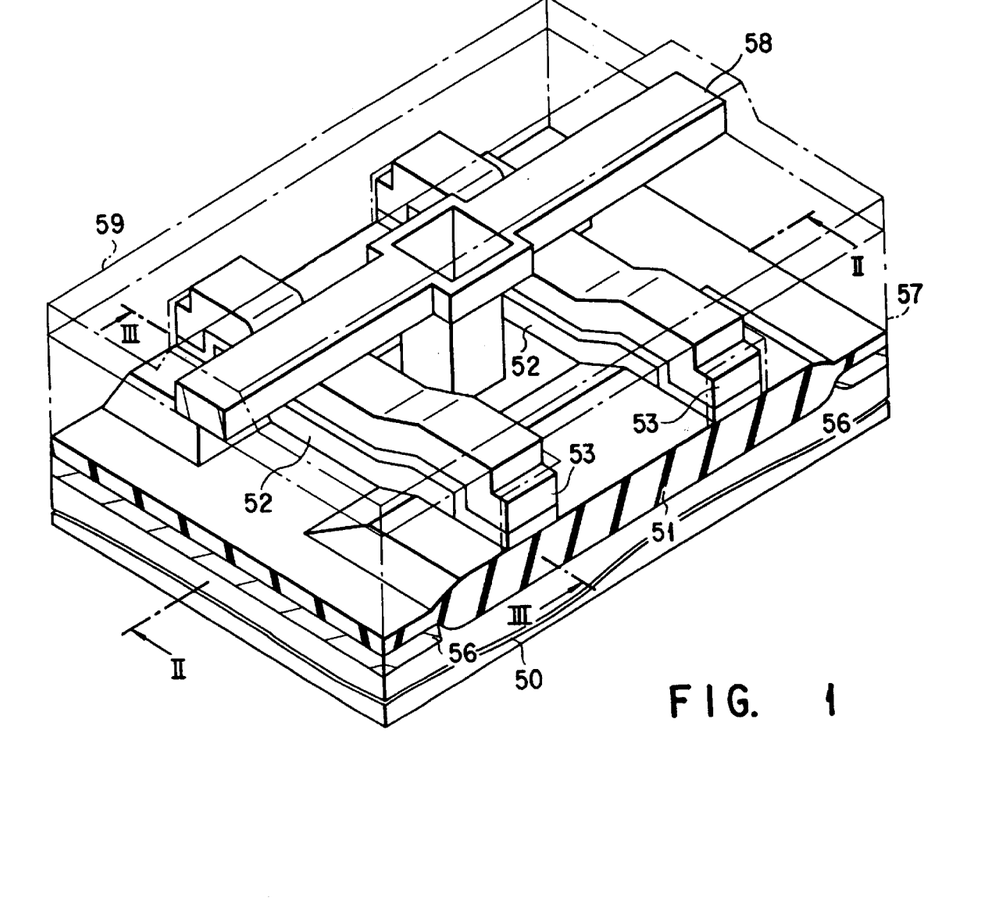
FIG. 1 is a view showing a semiconductor device manufactured by a manufacturing method of the present invention.
Figure 2:
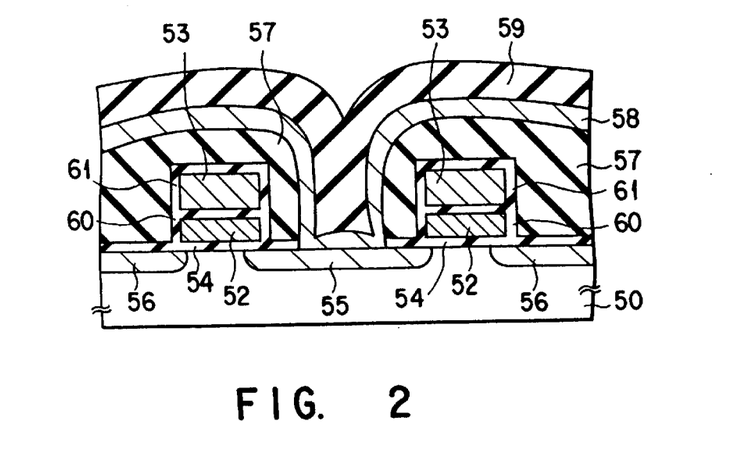
FIG. 2 is a cross-sectional view taken along a line of II—II of FIG. 1.
Figure 3:
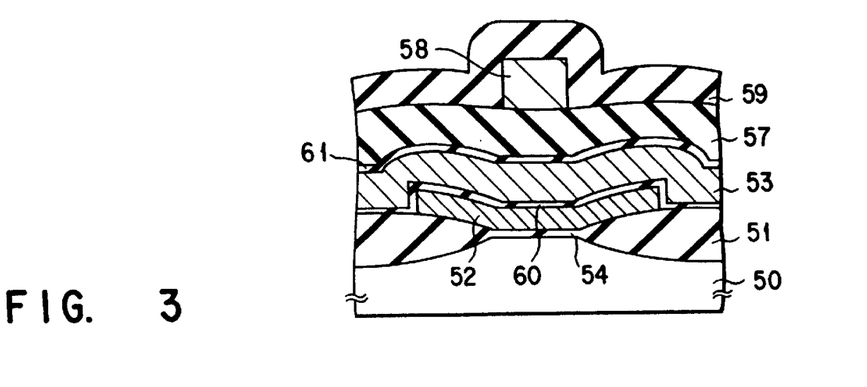
FIG. 3 is a cross-sectional view taken along a line of III—III of FIG. 1.

FIG. 1 is a view showing EEPROM to which the manufacturing method of the present invention is applied. FIG. 2 is a cross-sectional view taken along line of II—II of FIG. 1; and FIG. 3 is a cross-sectional view taken along line of III—III of FIG. 1.

A field oxide film 51 is formed on a semiconductor substrate 50. A memory cell is formed in an element area surrounded with the field oxide film 51. The memory cell comprises a floating gate electrode 52, a control gate electrode 53, a drain region 55, and a source region 56.

A BPSG film (interlayer insulating film) 57 is formed to cover the memory cell. For example, the BPSG film 57 is formed by a CVD method using material gas containing gas ($SiH_4$, $SiH_2Cl_2$) having an Si—H combination. In this case, the amount of the Si—H combination of the BPSG film 57 may be set to $0.6 \times 10^{21}$ $cm^{-3}$ or less in view of reducing the amount of electronic trap in the gate oxide film of the transistor.

In the present invention, the interlayer insulating film is not limited to BPSG film 57. A PSG film, an undope $SiO_2$ film, plasma CVD-$SiO_2$ film using $SiH_4$ or TEOS as material gas, a SOG (Spin On Glass) film can be used.

A bit line 58 is connected to the drain region 55 of the memory cell. An SiON film (passivation film) 59 is formed to cover the bit line 58. The SiON film 59 is formed by the CVD method using material gas containing gas having an Si—H combination. In this case, the amount of the Si—H combination of the SiON film 59 may be set to $0.6 \times 10^{21}$ cm$^{-3}$ or less in view of reducing the amount of electronic trap in the gate oxide film of the transistor.

Also, a refractive index of the SiON film 59 is set to 1.65 or more, and concentration of nitrogen contained in the SiON film 59 is set to $3 \times 10^{21}$ cm$^{-3}$. Thereby, the moisture vapor resistance of the SiON 59 can be sufficiently ensured.

The following will explain a first embodiment of the semiconductor device manufacturing method of the present invention in which EEPROM of FIGS. 1 to 3 is exemplified.

Figure 4:
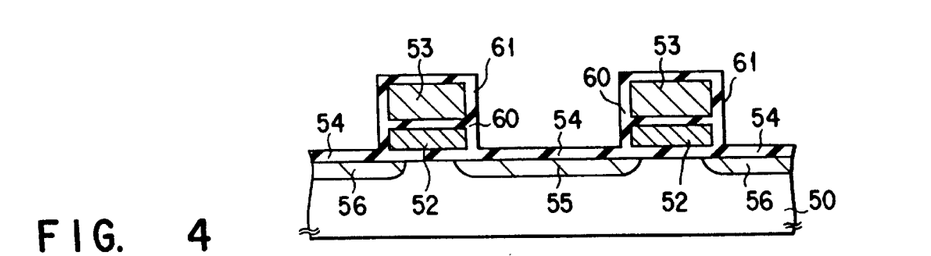
FIG. 4 is a cross-sectional view showing one process of the manufacturing method of the present invention.
Figure 8:
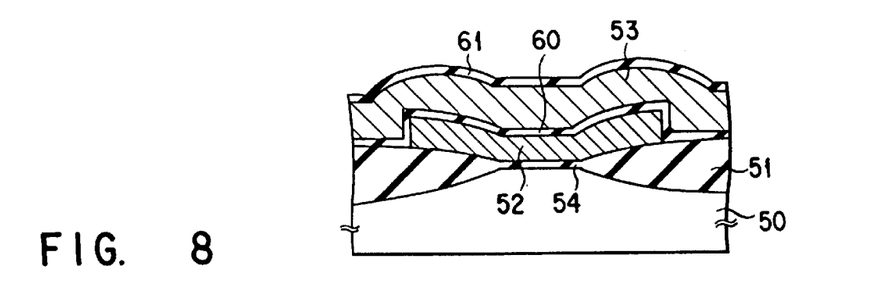
FIG. 8 is a cross-sectional view showing one process of the manufacturing method of the present invention.

As shown in FIGS. 4 and 8, a surface of a P type monocrystal silicon substrate 50 is selectively oxidized to form a field oxide film 51 having a silicon oxide film whose thickness is about 500 nm. Thereafter, thermal oxidation is performed so that a gate oxide film 54, which has a silicon oxide film whose thickness is about 10 nm, is formed on the element region surrounded with the field oxide film 51.

A first polysilicon film having a thickness of about 200 nm is formed on the entire surface of the silicon substrate 50. The silicon substrate 50 is heated in atmosphere of POCL$_3$ to introduce impurity material (phosphorous) to the first polysilicon film.

Also, a resist pattern is formed by a photo engraving process, and the resist pattern is used as a mask so that the first polysilicon film is partially etched by RIE method to form an opening portion. The opening portion is used to separate floating gate electrodes of the adjacent memory cells from each other in patterning the floating gate electrodes to be performed later.

Sequentially, thermal oxidation is performed so that a silicon oxidation film 60 having a thickness of about 30 nm is formed on the surface of the first polysilicon film. Sequentially, a second polysilicon film is formed on the entire surface of the silicon substrate 50 by the CVD method. The silicon substrate 50 is heated in atmosphere of POCl$_3$ to introduce impurity material (phosphorous) to the second polysilicon film.

A silicide film is formed on the second polysilicon film. The total thickness of the second polysilicon film and the silicide film is set to, e.g., about 500 nm.

Thereafter, a resist pattern is formed by the photo engraving process, and the resist pattern is used as a mask. Then, the silicide film, the second polysilicon film, and the first polysilicon film are etched by the RIE method. As a result, the floating gate electrode 52 and the control gate electrode 53 are formed.

Also, the floating gate electrode 52 and the control gate electrode 53 are used as a mask, and N type impurity material such as phosphorus is ion-implanted to the silicon substrate 50. Then, thermal oxidation is performed, and a silicon oxide film 61 is formed on the surface of the floating gate electrode 52 and that of the control gate electrode 53. Also, N type impurity material of the silicon substrate 50 is activated so as to form the drain region 55 and the source region 56.

Figure 5:
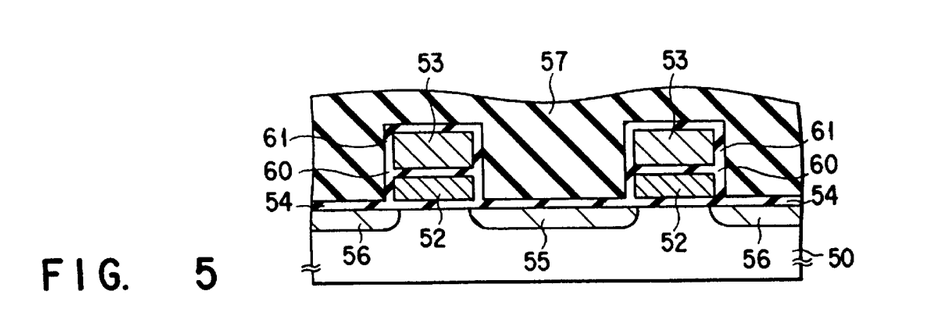
FIG. 5 is a cross-sectional view showing one process of the manufacturing method of the present invention.
Figure 9:
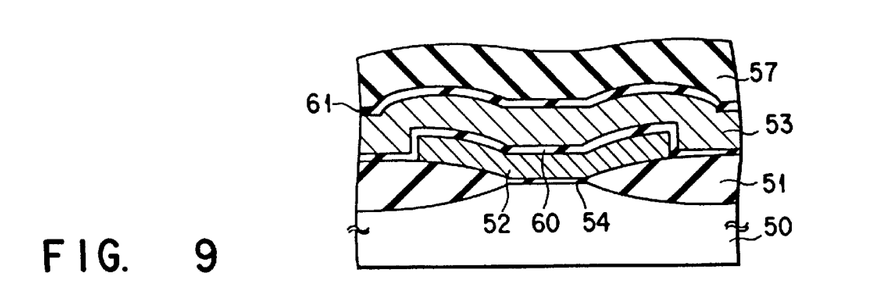
FIG. 9 is a cross-sectional view showing one process of the manufacturing method of the present invention.

Next, as shown in FIGS. 5 and 9, the BPSG film (interlayer insulating film) 57 is formed to cover the memory cell comprising the floating gate electrode 52, the control gate electrode 53, the drain region 55, and the source region 56. Also, the surface of the BPSG film 57 is flattened by a heating process.

Figure 6:
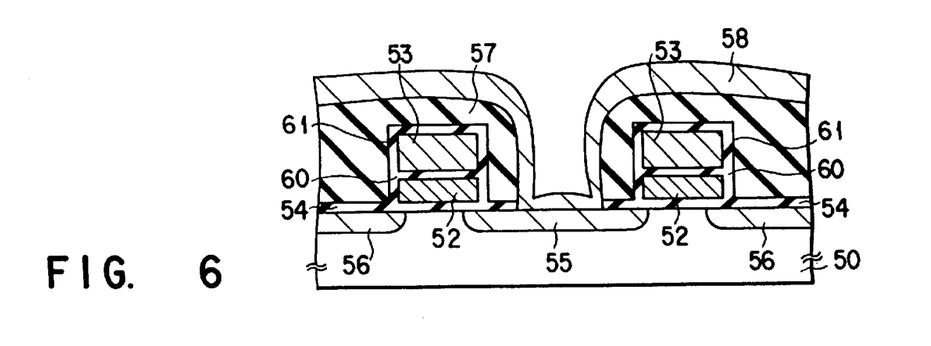
FIG. 6 is a cross-sectional view showing one process of the manufacturing method of the present invention.
Figure 10:
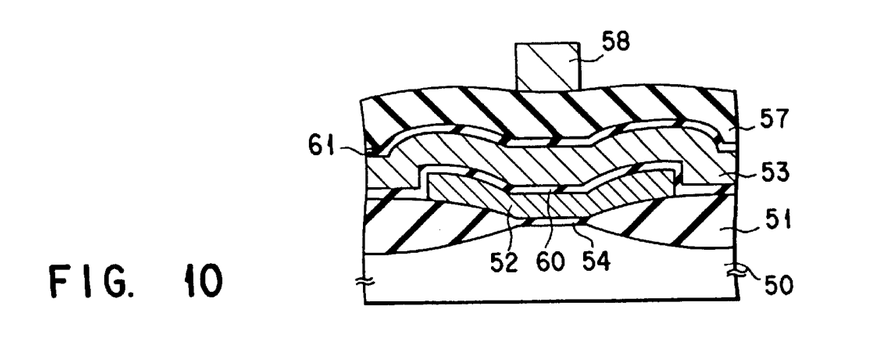
FIG. 10 is a cross-sectional view showing one process of the manufacturing method of the present invention.

Next, as shown in FIGS. 6 and 10, a resist pattern is formed by the photo engraving process, and the resist pattern is used as a mask so that the BPSG film 57 is etched by RIE method to form a contact hole reaching the drain region 55.

Thereafter, a metallic film, e.g., an aluminum alloy film having a thickness of about 800 nm is formed on the BPSG film 57 by sputtering. A resist pattern is formed by the photo engraving process, and the resist pattern is used as a mask so that the metallic film is etched by RIE method to form a wire. A part of the wire serves as a bit line 58.

Figure 7:
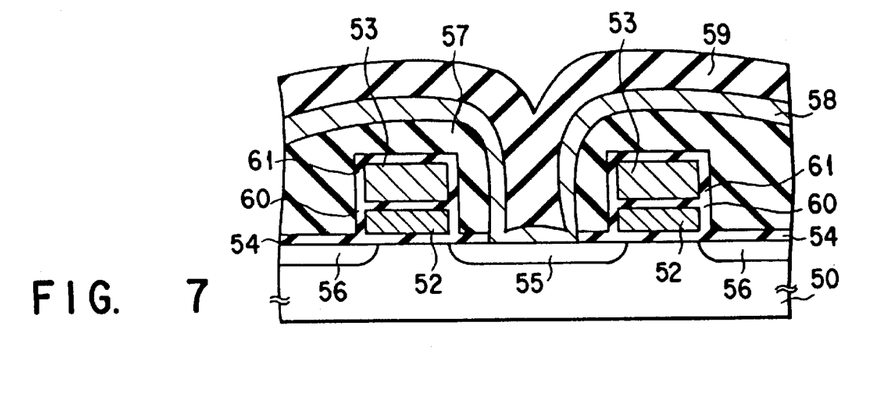
FIG. 7 is a cross-sectional view showing one process of the manufacturing method of the present invention.
Figure 11:
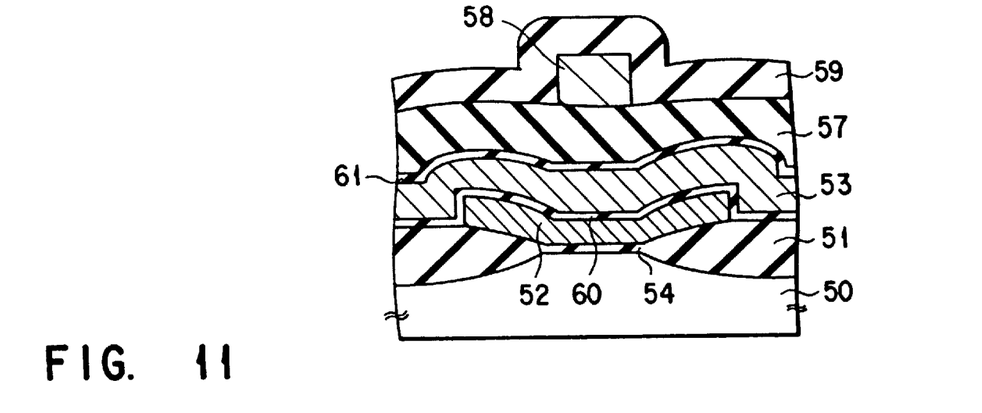
FIG. 11 is a cross-sectional view showing one process of the manufacturing method of the present invention.

Next, as shown in FIGS. 7 and 11, for example, a substrate temperature and a frequency are set to about 400° C., about 13.56 MHz, respectively. Then, by use of gases such as SiH$_4$, N$_2$O, NH$_3$, N$_2$, the SiON film (passivation film) 59 is formed. At this time, if the refractive index of the SiON film 59 is set to 1.65 or more, the moisture vapor resistance of the SiON film 59 can be sufficiently ensured.

Thereafter, in atmosphere of nitrogen gas or mixing gas of hydrogen and nitrogen, the anneal process is performed at about 400° C. for about one hour. By the anneal process, water of the PBSG film (interlayer insulating film) 57 is transmitted through the SiON film (passivation film) 59 to be dispersed to the outer portion of the semiconductor device (LSI). As a result, the amount of water of the BPSG film 57 is reduced.

The temperature at the anneal process exceeds about 350° C. to attain the sufficient outward dispersion of water, and sets to be below the melting point of material (e.g., aluminum, aluminum alloy, etc) constituting the metallic wire including the bit line 58 in order to protect the metallic wire.

The annealing time depends on water permeability of the SiON film (passivation film) 59. In other words, according as the water permeability of the SiON film 59 is lower, the more annealing time is needed.

For executing the anneal process to remove water of the BPSG film (interlayer insulating film) 57 after forming an opening for exposing a bonding pad is formed on the SiON film (passivation film) 59, the anneal process can be performed as confirming the effect of water removal due to the annealing.

This confirmation can be performed by the following way:

For example, a constant current stress is applied to a capacitor prepared to resemble the memory cell, thereby monitoring the variation of the voltage (gate voltage) of a polysilicon film serving as one electrode of the capacitor.

If the current is supplied to the capacitor, the electrons are passed through the oxide film of the capacitor. Then, the part of the electrons is captured by the electronic trap in the oxide film of the capacitor.

The electron captured in the oxide film has an effect of reducing an effective electric field. It is assumed that the same amount of current as the current following into the capacitor before the electron is captured in the oxide film is made to flow into the capacitor after the electron is captured in the oxide film. The gate voltage after the electron is captured in the oxide film becomes higher than the gate voltage before the electron is captured in the oxide film.

If the amount of the electronic trap in the oxide film of the capacitor is large, the amount of the electrons captured in the oxide film of the capacitor is large. As a result, the amount of variations of the gate voltage after the application of constant current stress becomes large. Conversely, if the amount of the electronic trap in the oxide film of the capacitor is small, the amount of variations of the gate voltage after the application of constant current stress becomes small.

Then, the semiconductor device is taken up from an anneal furnace after annealing for a fixed period of time, thereby detecting the amount of variations of the gate voltage. Then, if the amount of the variations of the gate voltage reaches a value, which is less than a predetermined amount, the anneal process is completed. If the amount of the variations of the gate voltage reaches a value, which is larger than the predetermined amount, the anneal process is further continued.

By repeating the above steps, the anneal process of completely removing water can be performed.

Thus, EEPROM shown in FIGS. 1 to 3 can be completed by the above-mentioned process.

The comparison between the semiconductor device manufactured by the manufacturing method of the present invention and the semiconductor device manufactured by the conventional manufacturing method having no last anneal process can be explained as follows:

Specifically, in the semiconductor device of the present invention, the amount of water of the BPSG film 57, serving as an interlayer insulating film, can be sufficiently reduced as compared with the conventional semiconductor device. As a result, the amount of the electronic trap in the gate oxide film of the memory cell transistor is reduced.

According to the semiconductor device of the present invention, the hot carrier resistance of the memory cell transistor is high, and the deterioration of the writing and erasing characteristic of the memory cell transistor is low as compared with the conventional semiconductor device.

In the above explained manufacturing method, the anneal process is performed after forming SiON film (passivation film) 59 to reduce water of BPSG film (interlayer insulating film) 57. However, the anneal process may not be performed before forming SiON film 59.

The advantage of the case in which the anneal process is performed before forming SiON film 59 lies in the following point:

Specifically, since the passivation film does not exist on BPSG film 57, water of BPSG film 57 can be easily dispersed into the outer portion, and annealing time can be reduced.

On the other hand, the disadvantage of the case in which the anneal process is performed before forming SiON film 59 liens in the point:

Specifically, since the passivation film does not exist on BPSG film 57, there is high possibility that BPSG film 57 will absorb water in air after the completion of the anneal process.

In order to improve the above disadvantage, it is needed that an amount of time, which is from the end of the annealing till the formation of SiON 59, be extremely reduced. Or, it is needed that the process, which is from the annealing to the formation of SiON film 59, be continuously performed by the same device.

The anneal process for reducing water of BPSG film 57 can be performed below atmospheric pressure in place of under atmospheric pressure. If the anneal process is performed below atmospheric pressure, the annealing time can be reduced, and annealing temperature can be decreased.

Thus, according to the above-explained semiconductor device manufacturing device, the anneal process is performed just before or after the formation of the passivation film, thereby reducing water of the interlayer insulating film, which is the cause of the electronic trap in the gate oxide film of the memory cell transistor.

In the case of the anneal process just after the formation of the passivation film, the surface of the semiconductor device (LSI) is protected by the passivation film. As a result, it is unnecessary to execute the anneal process in the cleaning room. In other words, since the large number of wafers can be processed in the outer portion of the cleaning room, the cost due to the anneal process newly provided in the present invention can be restrained to the minimum.

The amount of water (hygroscopicity) in the interlayer insulating film (BPSG film) is changed by time, which is required to form the interlayer insulating film, and time, which is from the formation of the interlayer insulating film till the formation of the passivation film. Therefore, it is difficult to define temperature and time of annealing for appropriately removing water of the interlayer insulating film.

However, according to the manufacturing method explained the embodiment of FIGS. 4 to 11, a pattern for testing formed in the wafer in advance is used after the anneal process just after the formation of the passivation film. Thereby, the amount of electronic trap in the gate oxide film of the memory cell transistor is monitored. Then, in the case in which the amount of electronic trap is larger than the necessity, the anneal process can be performed again.

Thus, the amount of electronic trap in the gate oxide film of the memory cell transistor is monitored. Then, the number of anneal processes is increased as required. Thereby, yield in a reliability test can be improved, and this can contribute to the improvement of reliability of the product after shipping.

Regarding the monitor of the amount of electronic trap, the gate oxide film of the memory cell transistor is not directly monitored. Specifically, the capacitor, which comprises an oxide film on the semiconductor substrate prepared to resemble the gate oxide film of the memory cell transistor and a polysilicon film, can be monitored to detect the amount of electronic trap.

Figure 12:
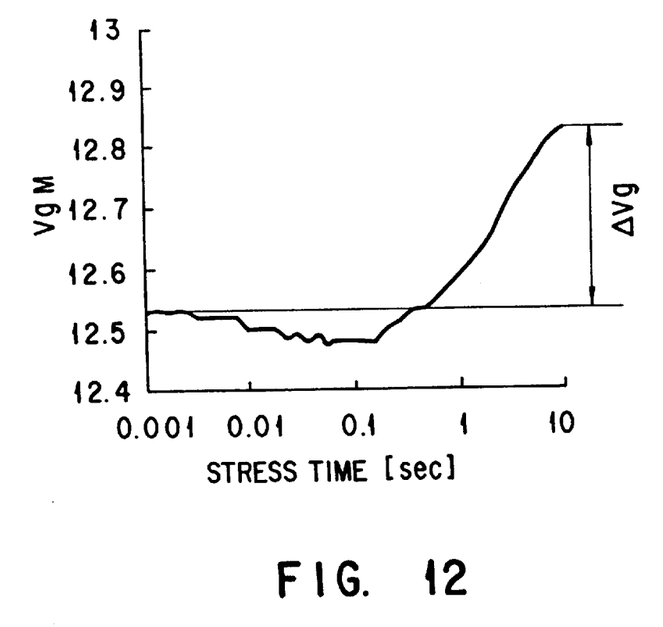
FIG. 12 is a view showing the relationship between a constant current stress applied to capacitor and a gate voltage.

The following will explain the monitoring method of the amount of electronic trap:

FIG. 12 is a view showing a function of time showing a change of the gate voltage in a case where a constant current stress is applied to a capacitor used in the monitoring method of the amount of electronic trap.

Specifically, the amount of the electronic trap in the oxide film can be monitored by detecting the variation of the gate voltage (voltage of the polysilicon film) in the case in which the constant current stress is applied to the capacitor. In the figure, $\Delta Vg$ shows the variation of the gate voltage when the constant current stress is applied to the capacitor used in the method for monitoring the amount of the electronic trap for about 10 seconds.

According as the amount of electronic trap in the oxide film is increased, the variation $\Delta Vg$ of the gate voltage becomes large.

In other words, if the current flows to the capacitor, the electrons are passed through the oxide film of the capacitor. At this time, the part of the electrons passing through the oxide film is captured by the electronic trap in the oxide film. The electron captured in the oxide film has an effect of decreasing the effective electric field applied to the oxide film.

As a result, it is assumed that the same amount of current as the current following into the capacitor before the electron is captured in the oxide film is made to flow into the capacitor after the electron is captured in the oxide film. The gate voltage after the electron is captured in the oxide film must be higher than the gate voltage before the electron is captured in the oxide film.

For example, if the amount of the electronic trap in the oxide film of the capacitor is large, the amount of electrons captured in the oxide film is increased within a fixed period of time. As a result, the variation ΔVg of the gate voltage before and after the constant current stress is applied for a fixed period of time is increased. Conversely, if the amount of the electronic trap in the oxide film of the capacitor is small, the amount of electrons captured in the oxide film is decreased within a fixed period of time. As a result, the variation ΔVg of the gate voltage before and after the constant current stress is applied for a fixed period of time is decreased.

Thus, by detecting the variation ΔVg of the gate voltage in the case in which the constant current stress is applied to the capacitor only for a fixed period time, it is possible to known the amount of the electronic trap in the oxide film of the capacitor.

Therefore, based on the above-mentioned result, only an appropriate number of anneal processes can be performed after forming the passivation film.

Figure 13:
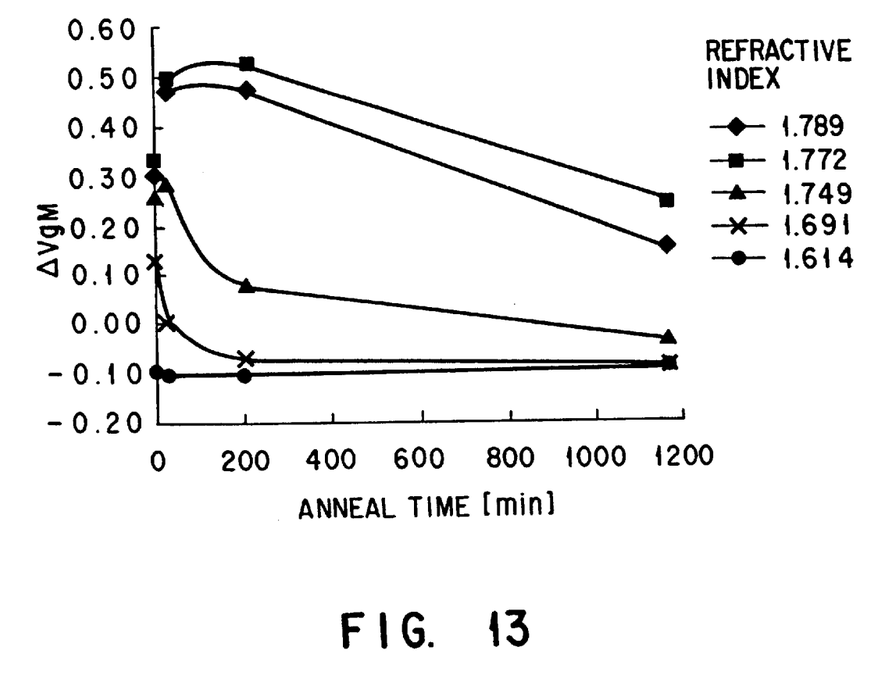
FIG. 13 is a view showing the relationship between anneal time and a variation of the gate voltage.

FIG. 13 is a view showing the relationship between anneal time and a variation of the gate voltage in a case in which the anneal process is added to a sample by a predetermined period of time.

In the figure, as the passivation film, an SiON film having a thickness of about 1000 nm is used, anneal temperature is set to about 400° C. Also, in the figure, a refractive index of the passivation film is used as a parameter, and a plurality of experimental results are shown.

According to the relationship shown in the figure, by increasing anneal time, the variation ΔVg of the gate voltage can be reduced. In other words, the amount of electronic trap in the oxide film formed between the gate electrode (polysilicon film) and the semiconductor substrate can be reduced.

If the refractive index of the passivation film is about 1.69, the anneal process is performed for 200 minutes. Thereby, the amount of electronic trap can be reduced to the same extent as the case in which no passivation film exists.

Judging from the above point, if the refractive index of the passivation film is about 1.65, the anneal process is performed for about 60 minutes. Thereby, it can be considered that the amount of electronic trap can be reduced to the same extent as the case in which no passivation film exists.

An outward dispersion of water in the interlayer insulating film (e.g., BPSG film) is considered to depend on the velocity at which water molecules is dispersed in the interlayer insulating film or the passivation film. At this time, dispersion coefficient D showing the velocity of dispersion can be expressed by the following equation:

$$D = D_0 \cdot \exp(-E_a/kT) \tag{1}$$

where $D_0$ is a constant depending on material of the interlayer insulating film and that of the passivation film, $E_a$ is active energy, k is Boltzmann's constant, and T is anneal temperature (absolute temperature). In the case of dispersion of water molecules, it can be understood that Ea is about 0.79 eV.

If a typical dispersion distance (distance where water molecules disperse at a unit of time) is expressed by use of "D" shown in equation (1), the following equation (2) can be obtained.

$$d = 2 \cdot (D \times t)^{1/2} \tag{2}$$

where t is annealing time.

Also, if the water molecules pass through the passivation film to disperse to the outer portion of the semiconductor device (LSI), the following simple proportional relationship is considered to be established between the film thickness L (nm) of the passivation film and the typical dispersion distance d:

$$L \; 2^\vee \; \overline{Dt} \tag{3}$$

Therefore, the following equation can be established:

$$t = A \times L^2 / \{D_0 \cdot \exp(-E_a/kT)\} \tag{4}$$

where A is a suitable constant.

According to claim 13, in the case in which L=1000 nm and T=673K, annealing time for obtaining the same amount of electronic trap as the case in which no passivation exists is t=60 minutes. Then, the result is substituted for equation (4), and counted backward. Thereby, $A \times D_0$ can be obtained.

In other words, the relationship between annealing time t and annealing temperature T can be expressed by the following expression:

$$t = 7.86 \times 10^{-11} \times L^2 \times \exp(9115/T)$$

In this case, even if annealing is performed for a long period of time, no characteristic problem occurs. Due to this, actual annealing time t, which can be obtained when anneal temperature is T, can be expressed by the following equation (5):

$$t \geq 7.86 \times 10^{-11} \times L^2 \times \exp(9115/T) \tag{5}$$

The above embodiment explained the case in which the anneal process for discharging water of the interlayer insulating film to the outer portion of the semiconductor device (LSI) may be performed just before forming the passivation film.

In this case, since anneal temperature and anneal time to have the same dispersion distance may be controlled, the same calculation as the case in which the passivation film exists.

As a result, the relationship between anneal time t and anneal temperature T can be expressed as the following equation (6):

$$t \geq 7.86 \times 10^{-5} \times \exp(9115/T) \tag{6}$$

Next, the following will explain a second embodiment of the manufacturing method of the semiconductor device of the present invention in which EEPROM is used as an example.

Figure 14:
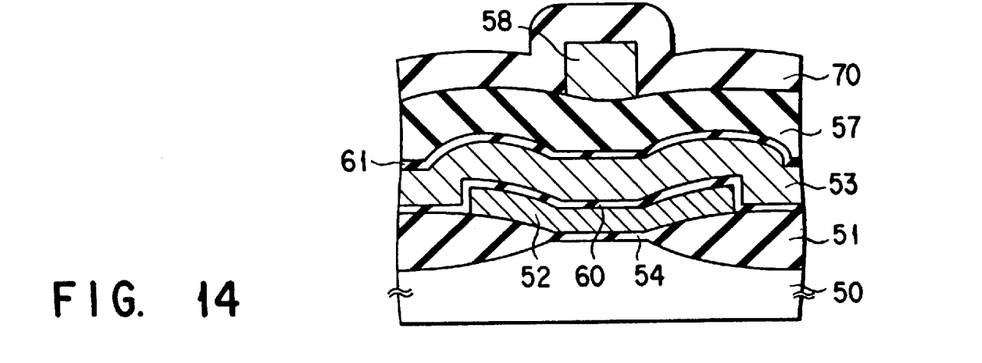
FIG. 14 is a cross-sectional view showing one process of the manufacturing method of the present invention.

As shown in FIG. 14, the first step to the step of forming the wire including the bit line 58 are performed by the same manufacturing method as the first embodiment.

Next, the substrate temperature is set to about 400° C., and the frequency is set to about 13.56 MHz. Then, in the plasma atmosphere, a passivation film (SiON film, $SiO_2$ film, etc.) 70 is formed by use gases, $SiH_4$, $N_2O$, $HH_3$, $N_2$. At this time, moisture vapor resistance of the passivation film 70 may not be sufficiently set. In other words, the refractive index of the passivation film 70 is not limited.

However, the moisture vapor resistance of the passivation film 70 may be set to be at least higher than that of the interlayer insulating film 57.

Thereafter, in atmosphere of nitrogen gas or mixing gas of hydrogen and nitrogen, the anneal process is performed at about 400° C. for about 60 minutes. By this anneal process, water of the PBSG film (interlayer insulating film) 57 is passed through the passivation film 70 to be dispersed to the outer portion of the semiconductor device (LSI). As a result, the amount of water of the BPSG film 57 is reduced.

The annealing temperature is set to exceed about 350° C., and below the melting point of materials (e.g., aluminum, aluminum alloy, etc) constituting the metallic wire including the bit line 58 in order to protect the metallic wire.

The annealing time depends on water permeability of the passivation film 70. The anneal time can be calculated by equation (5) or (6) explained in the first embodiment.

According to the present invention, the anneal process is performed in order to control the amount of the electronic trap in the tunnel insulating film, thereby increasing reliability of the memory cell transistor. Then, the anneal process can be applied to a nonvolatile semiconductor memory such as an EEPROM having a memory cell transistor comprising a gate oxide film as a tunnel insulating film just under an electric charging layer from a floating gate electrode.

As compared with the anneal for the purpose of reducing pose-failure of DRAM (e.g., Japanese Patent Application KOKAI Publication No. 61-219141) or the anneal (sinter) for increasing the degree of movement of the transistor, the present invention differs from the conventional case as follows:

It is assumed that the anneal temperature of the present invention is the same as the conventional case. The anneal time is longer than the conventional case.

For example, in the case of the anneal disclosed in Japanese Patent Application KOKAI Publication No. 61-219141, when the anneal temperature was about 350° C., the anneal time was about 60 minutes. In the anneal of the present invention, when the anneal temperature is about 350° C., the anneal time is about 117 minutes.

The anneal process is performed under atmosphere. However, if the anneal process is performed below atmosphere, water dispersion effect can be more increased, so that anneal time can be reduced. For example, in the condition of the pressure of 5 Torr, if the anneal temperature is about 400° C., the anneal time can be reduced to about 5 minutes.

Figure 15:
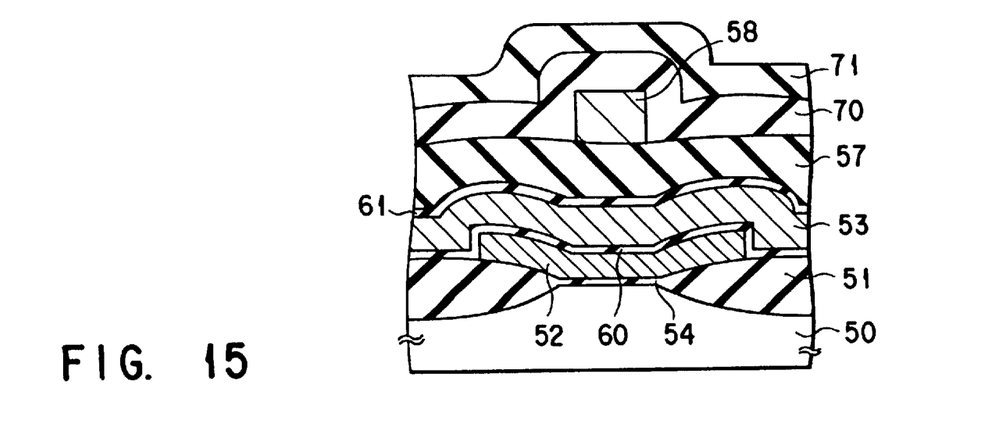
FIG. 15 is a cross-sectional view showing one process of the manufacturing method of the present invention.

Next, as shown in FIG. 15, the substrate temperature is set to about 400° C., and the frequency is set to about 13.56 MHz. Then, in the plasma atmosphere, a passivation film (SiON film, $Si_3N_4$, etc.) 71 is formed by use gases, $SiH_4$, $N_2O$, $HH_3$, $N_2$. At this time, it is required that the passivation film 71 have high moisture vapor resistance in order to prevent water and impurity materials from being permeated from the outer portion of the semiconductor device (LSI). In other words, the moisture vapor resistance of the passivation film 71 may be set to be at least higher than that of the passivation film 70.

According to the above-explained embodiment, by forming the passivation film 71, the amount of water of the interlayer insulating film 57 can be sufficiently reduced for the minimum annealing time, that is, about 60 minutes without improving moisture vapor resistance of the passivation film 70.

Since moisture vapor resistance of the passivation film 71 is good, water and impurity materials can be effectively prevented from being permeated from the outer portion of the semiconductor device (LSI).

By the above-explained process, EEPROM is completed.

Generally, if the insulating film having high moisture vapor resistance is used as a passivation film, water of the interlayer insulating film is moved to the gate oxide film. As a result, the amount of electronic trap in the gate oxide film is increased. However, in the above-explained embodiment, water of the interlayer insulating film is discharged to the outer portion of the semiconductor device (LSI) before depositing the passivation film having high moisture vapor resistance. As a result, the amount of the electronic trap in the gate oxide film is controlled.

Therefore, in the semiconductor device of the present invention, the hot carrier resistance of the memory cell transistor is high, and the deterioration of the writing and erasing characteristic of the memory cell transistor is low as compared with the conventional semiconductor device.

In the first embodiment, in consideration of long anneal time, it is difficult to actually use the passivation film having extremely high moisture vapor resistance in the case of annealing after forming the passivation film. However, in the second embodiment, relative short anneal time can be achieved, and the passivation film having extremely high moisture vapor resistance can be formed on the uppermost layer.

Thus, as explained above, according to the manufacturing method of the semiconductor device of the present invention, the following advantages can be obtained:

Specifically, in the semiconductor device including the semiconductor memory such as EEPROM, water of the interlayer insulating film causes the increase in the amount of the electronic trap in the gate oxide film of the transistor. However, the anneal process, which is different from the general anneal process, is performed for a relatively long period of time just before or after the passivation film having high moisture vapor resistance (low water permeability, low water absorption properties). Thereby, water of the interlayer insulating film can be reduced.

Also, the increase in the electronic trap in the gate oxide film of the transistor can be controlled. Thereby, improvement of reliability of the transistor can be attained.

Moreover, in the case where the plurality of insulating films is layered to form the passivation film, the insulating film whose moisture vapor resistance is not so good, is first formed. Just after forming the insulating film, the anneal process of the present invention is provided to the semiconductor device. Just after the anneal process, the insulating film having good moisture vapor resistance is formed. Thereby, anneal time can be reduced, and water of the interlayer insulating film can be sufficiently decreased.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a semiconductor device comprising the steps of:

forming a transistor having a gate insulating film an interlayer insulating film, and a wire on a semiconductor substrate;

forming a first passivation film, covering said transistor, said interlayer insulating film, and said wire;

annealing after forming said first passivation film; and forming a second passivation film, serving as an uppermost layer, having high moisture vapor resistance higher than said first passivation film, on said first passivation film after said annealing.

2. The method according to claim 1, further comprising the steps of:
monitoring an amount of electronic trap in the gate insulating film of said transistor after annealing before said second passivation film is formed; and
annealing again when said amount of electronic trap exceeds a predetermined value.

3. The method according to claim 1, wherein said annealing is performed under at least one of conditions of temperature exceeding 350° C. and time exceeding 60 minutes.

4. The method according to claim 3, wherein said annealing is performed at temperature below a melting point of said wire.

5. The method according to claim 1, wherein said annealing is performed under a condition satisfying the following equation:

$$t \geq 7.86 \times 10^{-11} \times L^2 \times \exp(9115/T)$$

where t is anneal time (minutes), L is a thickness (nm) of said first passivation film, and T is anneal temperature (absolute temperature).

6. The method according to claim 1, wherein said annealing is performed under pressure lower than atmosphere.

7. The method according to claim 1 wherein said transistor is a transistor constituting a memory cell of a semiconductor memory.

8. The method according to claim 1, wherein said first and second passivation films are one insulating film selected from silicon oxide, silicon nitride and silicon oxynitride, and each of said passivation films is formed by CVD.

9. The method according to claim 1, wherein said second passivation film is formed such that its refractive index is 1.65 or more.

10. The method according to claim 1, wherein said interlayer insulating film is formed of silicon glass, and water in said interlayer insulating film is discharged to an outer portion of said first passivation film by said anneal.

11. The method according to claim 1, wherein said first passivation film has moisture vapor resistance higher than that of said interlayer insulating film.

* * * * *